United States Patent
Kim et al.

(10) Patent No.: US 8,385,080 B2
(45) Date of Patent: Feb. 26, 2013

(54) SEMICONDUCTOR MODULE, SOCKET FOR THE SAME, AND SEMICONDUCTOR MODULE/SOCKET ASSEMBLY

(75) Inventors: Jung-Hoon Kim, Asan-si (KR);
Seong-Chan Han, Cheonan-si (KR);
Dong-Chun Lee, Asan-si (KR);
Jae-Hoon Choi, Cheonan-si (KR);
Sun-Kyu Hwang, Asan-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 217 days.

(21) Appl. No.: 13/006,692

(22) Filed: Jan. 14, 2011

(65) Prior Publication Data

US 2011/0216516 A1    Sep. 8, 2011

(30) Foreign Application Priority Data

Mar. 4, 2010  (KR) ........................ 10-2010-0019566

(51) Int. Cl.
*H05K 7/00*    (2006.01)
(52) U.S. Cl. .......... 361/783; 361/760; 361/785; 439/65; 439/260; 439/157
(58) Field of Classification Search ................. 361/760, 361/783–786; 439/65, 260, 488, 485, 157, 439/159

See application file for complete search history.

(56) References Cited

U.S. PATENT DOCUMENTS

| | | | |
|---|---|---|---|
| 6,672,888 B1 * | 1/2004 | Ku | 439/153 |
| 7,303,443 B1 * | 12/2007 | Beaman et al. | 439/637 |
| 2007/0076398 A1 * | 4/2007 | Dittus et al. | 361/801 |
| 2008/0038961 A1 * | 2/2008 | Park et al. | 439/630 |
| 2008/0074850 A1 * | 3/2008 | Kuo | 361/740 |
| 2009/0163048 A1 | 6/2009 | Sun | |

FOREIGN PATENT DOCUMENTS

| | | |
|---|---|---|
| JP | 2006041381 A | 2/2006 |
| JP | 2006221912 A | 8/2006 |
| KR | 100633086 A | 3/2006 |

* cited by examiner

*Primary Examiner* — Hoa C Nguyen
(74) *Attorney, Agent, or Firm* — Harness, Dickey & Pierce, P.L.C.

(57) ABSTRACT

A semiconductor module, a socket for the same, and a semiconductor module/socket assembly are disclosed. The semiconductor module includes a printed circuit board including a plurality of semiconductor devices, a plurality of insulating layers and a plurality of metal layers, the plurality of insulating layers and the plurality of metal layers are alternately stacked. Exposed portions of the metal layers are exposed to the outside of the semiconductor module at a first and a second ends of the printed circuit board. The first end and the second end are at opposite ends of the printed circuit board.

16 Claims, 6 Drawing Sheets

SEMICONDUCTOR MODULE, SOCKET FOR THE SAME, AND SEMICONDUCTOR MODULE/SOCKET ASSEMBLY

CROSS-REFERENCE TO RELATED APPLICATIONS

This application claims priority under 35 U.S.C. §119 from Korean Patent Application No. 10-2010-0019566, filed on Mar. 4, 2010, in the Korean Intellectual Property Office, the disclosure of which is incorporated herein in its entirety by reference.

BACKGROUND

Example embodiments of the inventive concepts relate to a semiconductor module on which semiconductor devices are mounted, a socket into which the semiconductor module is placed or inserted, and a semiconductor module/socket assembly.

As many electronic devices including semiconductor devices have been developed to have smaller sizes and operate at higher speeds, problems caused by heat generated in the semiconductor devices have become more severe.

A semiconductor module, for example, a memory semiconductor module, includes a plurality of memory semiconductor devices fixed, placed mounted on a printed circuit board (PCB). If heat generated in the plurality of semiconductor devices is not efficiently dissipated, the semiconductor module may suffer performance degradation, damage or failure due to thermal fatigue. Accordingly, it is necessary to cool the semiconductor module. To this end, a heat sink for improving the cooling performance by increasing a heat transfer rate per unit volume is often used as a cooling device. In order to ensure higher thermal reliability, research on a type and material of the heat sink and research on a thermal interface material (TIM) to reduce a thermal contact resistance between the heat sink and the semiconductor devices have been conducted actively.

A great part of the heat generated in the semiconductor devices is transferred to the PCB on which the semiconductor devices are mounted. Accordingly, there is a limitation in improving the heat-dissipation efficiency by using only the heat sink that contacts the surfaces of the semiconductor devices.

SUMMARY

Example embodiments of the inventive concepts provide a semiconductor module that dissipates heat generated in semiconductor devices, a socket for the semiconductor module, and a semiconductor module/socket assembly.

According to an aspect of the inventive concepts, there is provided a semiconductor module including a printed circuit board including a plurality of semiconductor devices, a plurality of insulating layers and a plurality of metal layers. The plurality of insulating layers and the plurality of metal layers being alternately stacked. Exposed portions of the plurality of metal layers are exposed to the outside of the semiconductor module at a first and a second ends of both surfaces of the printed circuit board, and the first end and the second end are at opposite ends of the printed circuit board.

The Plurality of insulating layers include outer insulating layers disposed on both surfaces of the printed circuit board and inner insulating layers. The plurality of metal layers may include ground metal layers disposed on inner surfaces of the outer insulating layers and signal lines, the signal lines and the inner insulating layers being alternately disposed between the ground metal layers. Portions of the outer insulating layers are removed by required, desired or predetermined widths from the first end and the second end of the printed circuit board.

In further example embodiments, the metal layers may include copper (Cu) or aluminum (Al).

In other example embodiments, a plurality of circuit connecting tabs may be arranged at lower portions of the printed circuit board, and a plurality of hook insertion grooves may be formed in the first and second ends of the printed circuit board.

According to another example embodiment of the inventive concepts, there is provided a socket into which a semiconductor module including a printed circuit board and a plurality of semiconductor devices mounted on the printed circuit board is inserted. The socket may include a base member configured to couple the printed circuit board of the semiconductor module. The socket may also include a plurality of latch members configured to secure the printed circuit board to the base member. The base member may include an inner body having a slot into which a first end of the printed circuit board is inserted. The base member may also include an outer body coupled to the inner body. The outer body being formed of a metal and including coupling portions formed at the first and second ends of the outer body. The outer body may also include a plurality of lower grooves formed in the plurality of coupling portions and configured to allow lower portions of the printed circuit board to be inserted thereinto.

The plurality of latch members may include a first latch body and a second latch body including a metal. The first latch body being pivotably coupled to the first coupling portion and the second latch body being pivotably coupled to the second coupling portion. The plurality of latch members may also include a first upper groove formed in the first latch body and a second upper groove formed in the second latch body. The first and the second upper grooves configured to allow each of upper portions of both longitudinal ends of the printed circuit board to be inserted thereinto.

Each of the outer body of the base member and the latch bodies of the latch members including copper (Cu) or aluminum (Al).

In a further example embodiment, the outer body includes at least one air guide grooves. The at least one air guide grooves may be formed in a first surface of the outer body and extend in a first direction of the outer body.

In another example embodiment, if the semiconductor module is inserted into the socket, the lower grooves and the first and the second grooves may be aligned.

The inner body may include an insulating material, and a plurality of socket pins arranged at both sides of the slot may be coupled to the inner body.

Each of the latch members may further include a hook inserted into each of hook insertion grooves of the printed circuit board. The hooks may be formed of an insulating material, and may be coupled as a separate member to the latch bodies.

According to another aspect of the inventive concepts, there is provided a semiconductor module/socket assembly including a semiconductor module and a socket for the semiconductor module, wherein the semiconductor module includes a printed circuit board. The printed circuit board may include plurality of insulating layers and a plurality of metal layers that are alternately stacked. The semiconductor module may also include a plurality of semiconductor devices mounted on the printed circuit board. The semiconductor module may also include a socket including a base member.

The base member may include an inner body having a slot into which a lower end of the printed circuit board is inserted, an outer body formed of metal coupled to the inner body. The socket may also include a first coupling portion formed at a first end of the outer body and a second coupling potion formed at a second end of the outer body. The socket may also include lower grooves formed in the first and the second coupling potions of a first and a second ends of the printed circuit board to be inserted thereinto. The first and the second ends of the printed are at opposite ends of the circuit board.

The socket may also include a first latch member including metal and a first latch body, the first latch body being pivotably coupled to the first coupling portion, and a second latch member including metal and a second latch body, the second latch body being pivotably couple to the second coupling portion. The first and the second latch members configured to allow upper portions of the first and the second ends of the printed circuit board to be inserted thereinto.

Exposed portions of the plurality of metal layers are exposed to the outside of the semiconductor module at the first and the second ends of the printed circuit board, and the exposed portions of the plurality of metal layers contact the outer body, the first latch body and the second latch body in the upper grooves, and the first coupling portion and the second coupling portion in the lower grooves.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
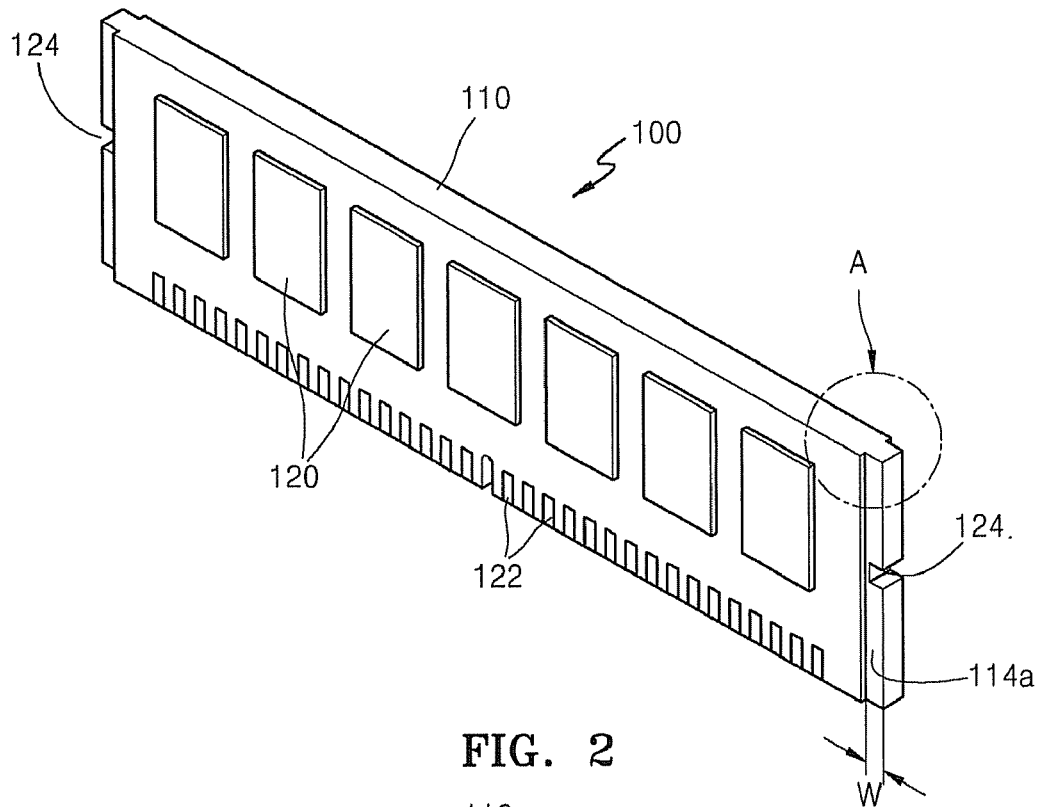
FIG. 1 is a perspective view of a semiconductor module according to embodiments of the inventive concepts.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural fauns as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

The inventive concepts will now be described more fully with reference to the accompanying drawings, in which exemplary embodiments of the inventive concepts are shown. In the drawings, the same reference numerals denote the same elements.

Figure 2:
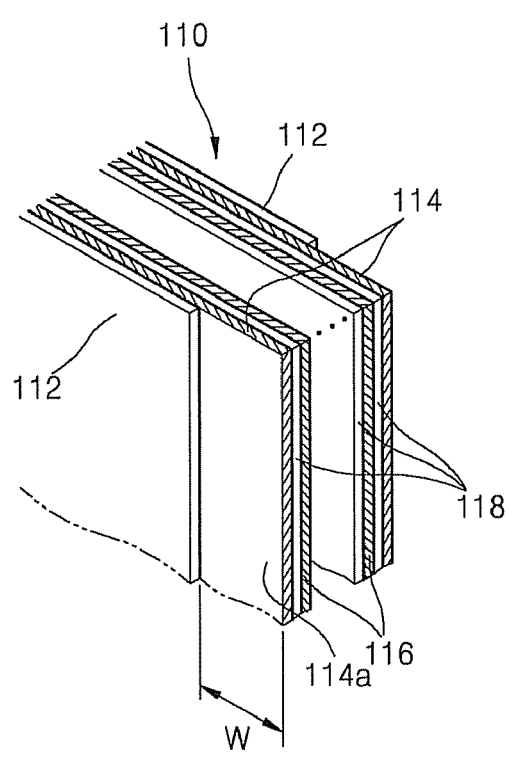
FIG. 2 is a partially enlarged perspective view illustrating a portion A of FIG. 1.

FIG. 1 is a perspective view of a semiconductor module 100 according to an embodiment of the inventive concepts. FIG. 2 is a partially enlarged perspective view illustrating a portion A of FIG. 1.

Referring to FIGS. 1 and 2, the semiconductor module 100, for example, a memory semiconductor module, includes a printed circuit board (PCB) 110 having a substantially rectangular plate shape, and a plurality of memory semiconductor devices 120, such as dynamic random access memories (DRAMs), mounted on the PCB 110. A plurality of circuit connecting tabs 122 are arranged at lower end portions of both surfaces of the PCB 110, and hook insertion grooves 124 into which hooks 238 (see FIG. 3) of latch members 230 (see FIG. 3) are inserted are formed in both longitudinal and side ends of the PCB 110.

The PCB 110 includes a plurality of metal layers 114 and 116 and a plurality of insulating layers 112 and 118. The insulating layers 112 include outer insulating layers 112 that are formed on both outer surfaces of the PCB 110. The metal layers 114 include ground metal layers 114 that are disposed on inner surfaces of the outer insulating layers 112. That is, outer surfaces of the ground metal layers 114 are covered by the outer insulating layers 112. The metal layers 116 may be metal layers 116 for signal lines and insulating layers 118 may include inner insulating layers 118 alternately disposed between the ground metal layers 114. Therefore, the plurality of metal layers 114 and 116 and the plurality of insulating layers 112 and 118 may be alternatively stacked. Additionally, each of the metal layers 114 and 116 may be formed of a metal having high electrical conductivity and thermal conductivity, for example, copper (Cu) or aluminium (Al).

As described above, since a greater amount of heat is generated in the memory semiconductor devices 120 of the semiconductor module 100, in order to reduce, limit or prevent performance degradation, failure and damage due to thermal fatigue, the heat should be efficiently dissipated. In particular, since a greater part of the heat generated in the memory semiconductor devices 120 is transferred to the PCB 110, it is efficient to dissipate the heat through the PCB 110.

To this end, exposed portions 114a of the ground metal layers 114 are exposed to the outside of the memory semiconductor module 100 at both longitudinal and side ends of both surfaces of the PCB 110. If the outer insulating layers 112 are removed from both longitudinal and side ends of both surfaces of the PCB 110 by required, desired or predetermined widths "W", the ground metal layers 114 disposed on the inner surfaces of the outer insulating layers 112 may be exposed by the required, desired or predetermined widths "W".

Figure 3:
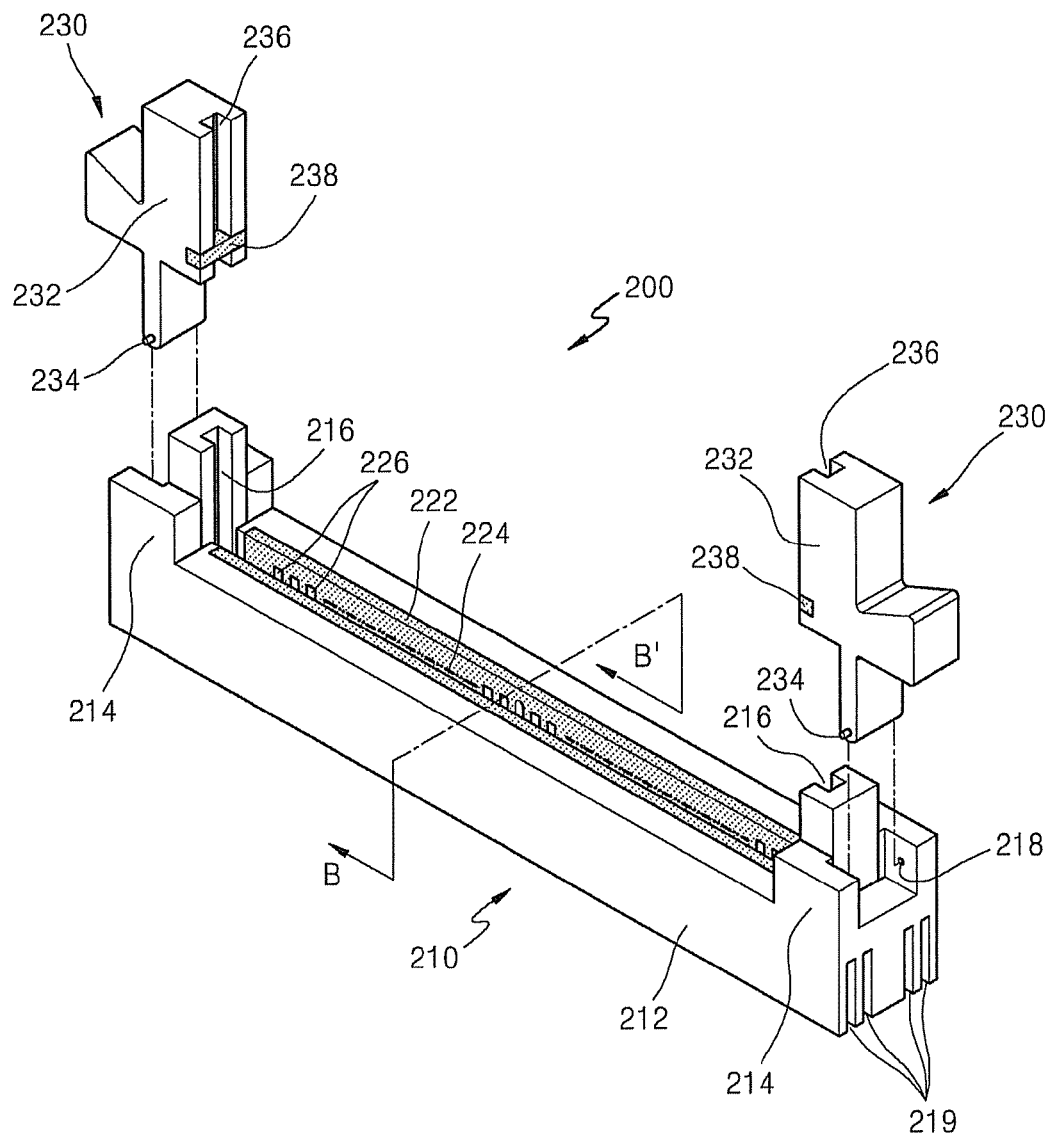
FIG. 3 is an exploded perspective view of a socket for the semiconductor module of FIG. 1, according to embodiments of the inventive concepts.

Referring to FIGS. 2 and 3, the exposed portions 114a of the ground metal layers 114 may contact an outer body 212 and latch bodies 232, and each formed of a metal, of a socket 200 as will be described later, and thus the heat generated in the memory semiconductor devices 120 may be efficiently conducted to the socket 200 through the PCB 110.

Figure 4:
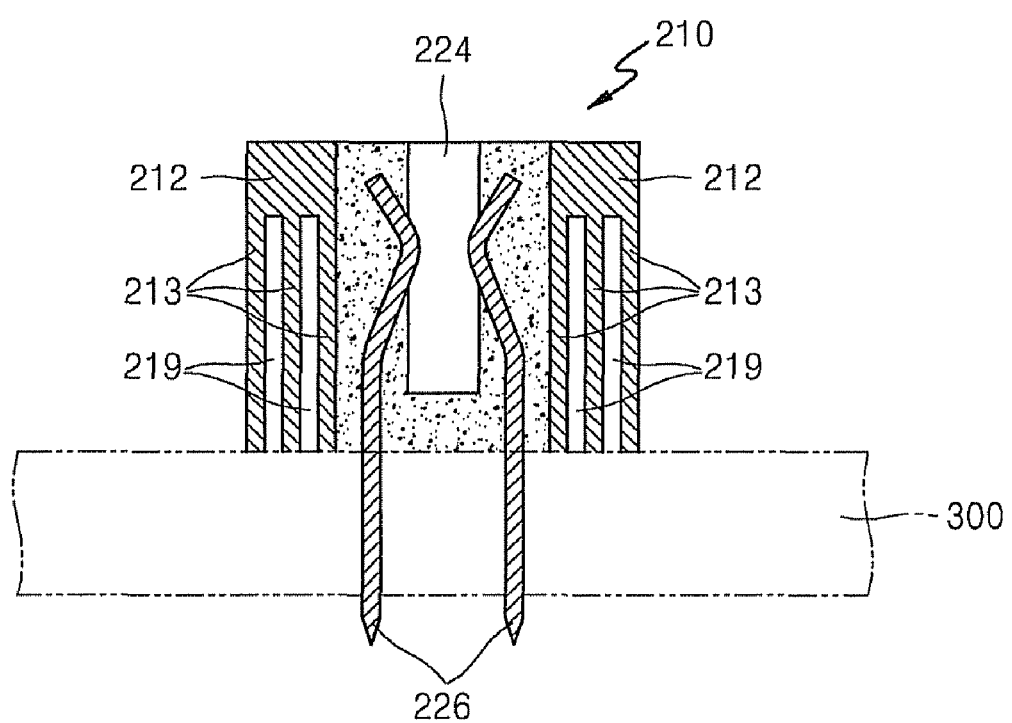
FIG. 4 is a cross-sectional view of a base member of the socket taken along line B-B' of FIG. 3.

FIG. 3 is an exploded perspective view of the socket 200 for the semiconductor module 100 of FIG. 1, according to an embodiment of the inventive concepts. FIG. 4 is a cross-sectional view of a base member 210 of the socket 200 taken along line B-B' of FIG. 3.

Referring to FIGS. 3 and 4, the semiconductor module 100 of FIG. 1 is placed or inserted into and supported by the socket 200 for mounting the semiconductor module 100. FIG. 4 illustrates that the socket may be fixed, installed or placed on a main board 300. Accordingly, the socket 200 electrically connects the semiconductor module 100 to the main board 300 and supports the semiconductor module 100. The socket 200 may include the base member 210 to which a lower end of the PCB 110 of the semiconductor module 100 is coupled with and latch members 230 for fixing or stabilizing the PCB 110.

The base member 210 may have a substantially long bar shape, and the base member 210 includes the outer body 212 and an inner body 222. A slot 224 extending in a longitudinal direction of the base member 210 is formed in a central portion of the inner body 222. The lower end of the PCB 110 of the semiconductor module 100 is placed, fixed or inserted into the slot 224. A plurality of socket pins 226 are used to electrically connect the plurality of circuit connecting tabs 122 of the semiconductor module 100 to the base member 210. The plurality of circuit connecting tabs 122 maybe arranged at the lower end portions of both surfaces of the PCB 110. The plurality of socket pins 226 are arranged at both sides of the slot 224, and are coupled to and supported by the inner body 222. If the socket 200 is installed on the main board 300, the socket pins 226 are electrically connected to circuits disposed in the main board 300. The inner body 222 may be formed of an insulating material for electrical insulation between the outer body 212 and the socket pins 226 each formed of a metal as will be described later.

The outer body 212 of the socket 200 is coupled to an outer surface of the inner body 222 of the socket 200. The outer body 212 includes coupling portions 214 disposed at both longitudinal and side ends of the outer body 212. The latch members 230 are pivotably coupled to the coupling portions 214. The latch members have lower grooves 216 into which lower portions of both longitudinal and side ends of the PCB 110 are fixed, placed or inserted. The outer body 212 may be formed of a metal having a higher thermal conductivity, for example, copper (Cu) or aluminium (Al). Accordingly, the coupling portions 214 of the outer body 212 and the exposed portions 114a of the ground metal layers 114 of the PCB 110 contact each other in the lower grooves 216. Since each of the coupling portions 214 and the exposed portions 114a of the ground metal layers 114 are formed of a metal having a higher thermal conductivity, heat generated in the memory semiconductor devices 120 may be efficiently conducted to the socket 200 if the coupling portions 214 contact the exposed portions 114a.

One or more air guide grooves 219 may be formed in the outer body 212. The air guide grooves 219 may be formed to a required, desired or predetermined depth from a bottom surface of the outer body 212 to extend in a longitudinal direction of the outer body 212. Accordingly, the outer body 212 may have a plurality of heat-dissipating fins 213 formed at a lower portion of the outer body 212. As described above, since the outer body 212 includes the one or more air guide grooves 219 and the plurality of heat-dissipating fins 213, heat-dissipation efficiency may be further improved.

Each of the latch members 230 includes a latch body 232 pivotably coupled to each of the coupling portions 214, and a hook 238 disposed on the latch body 232. A pivot shaft 234 protrudes or extends from a lower end of the latch body 232. If the pivot shafts 234 are placed, fixed or inserted into pivot shaft insertion grooves 218 formed in the coupling portions 214, the latch members 230 are pivotably coupled to the coupling portions 214. Upper grooves 236 into which upper portions of both longitudinal and side ends of the PCB 110 are fixed, placed or inserted are formed in the latch bodies 232. If the semiconductor module 100 is fixed, placed or inserted into the socket 200, the upper grooves 236 are aligned with the lower grooves 216 formed in the coupling portions 214 of the base member 210. The latch bodies 232 may be formed of a metal having higher thermal conductivity, for example, copper (Cu) or aluminium (Al). Accordingly, the latch bodies 232 and the exposed portions 114a of the ground metal layers 114 of the PCB 110 contact each other in the upper grooves 216. Since each of the latch bodies 232 and the exposed portions 114a of the ground metal layers 114 are formed of a metal having higher thermal conductivity, heat generated in the memory semiconductor devices 120 may be efficiently conducted to the socket 200 if the latch bodies 232 contact the exposed portions 114a of the ground metal layers 114.

The hooks 238 are placed, fixed or inserted into the hook insertion grooves 124 formed in both longitudinal and side ends of the PCB 110, so that the semiconductor module 100 is fixed or stabilized to the socket 200. Since the metal layers 116 for signal lines of the PCB 110 may be exposed through the hook insertion grooves 124, the hooks 238 may be formed of an insulating material so as to be insulated from the metal layers 116 for signal lines, and may be coupled as a separate member to the latch bodies 232 formed of a metal.

Figure 5:
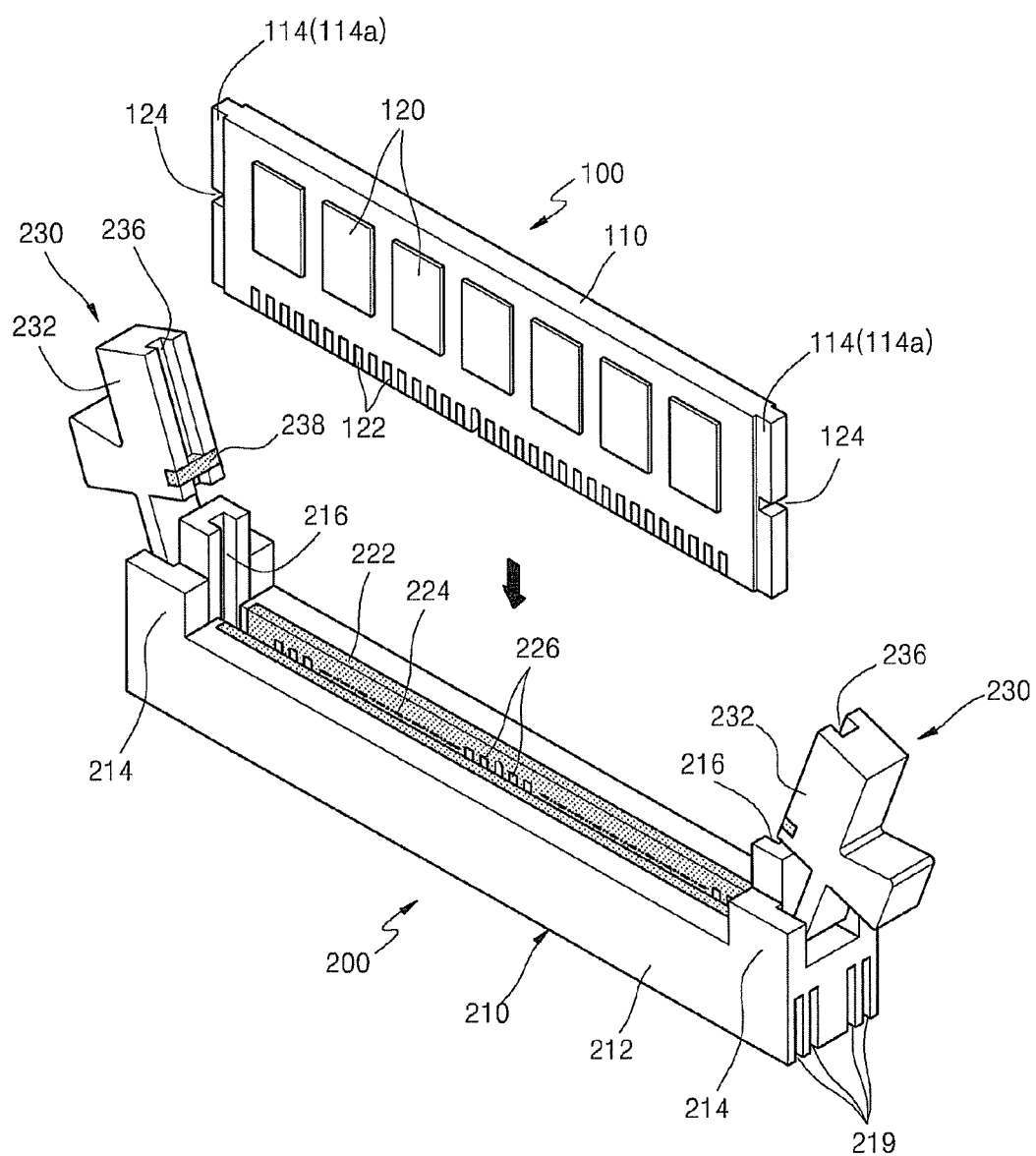
FIG. 5 is an exploded perspective view for explaining a process of inserting the semiconductor module of FIG. 1 into the socket of FIG. 3.
Figure 6:
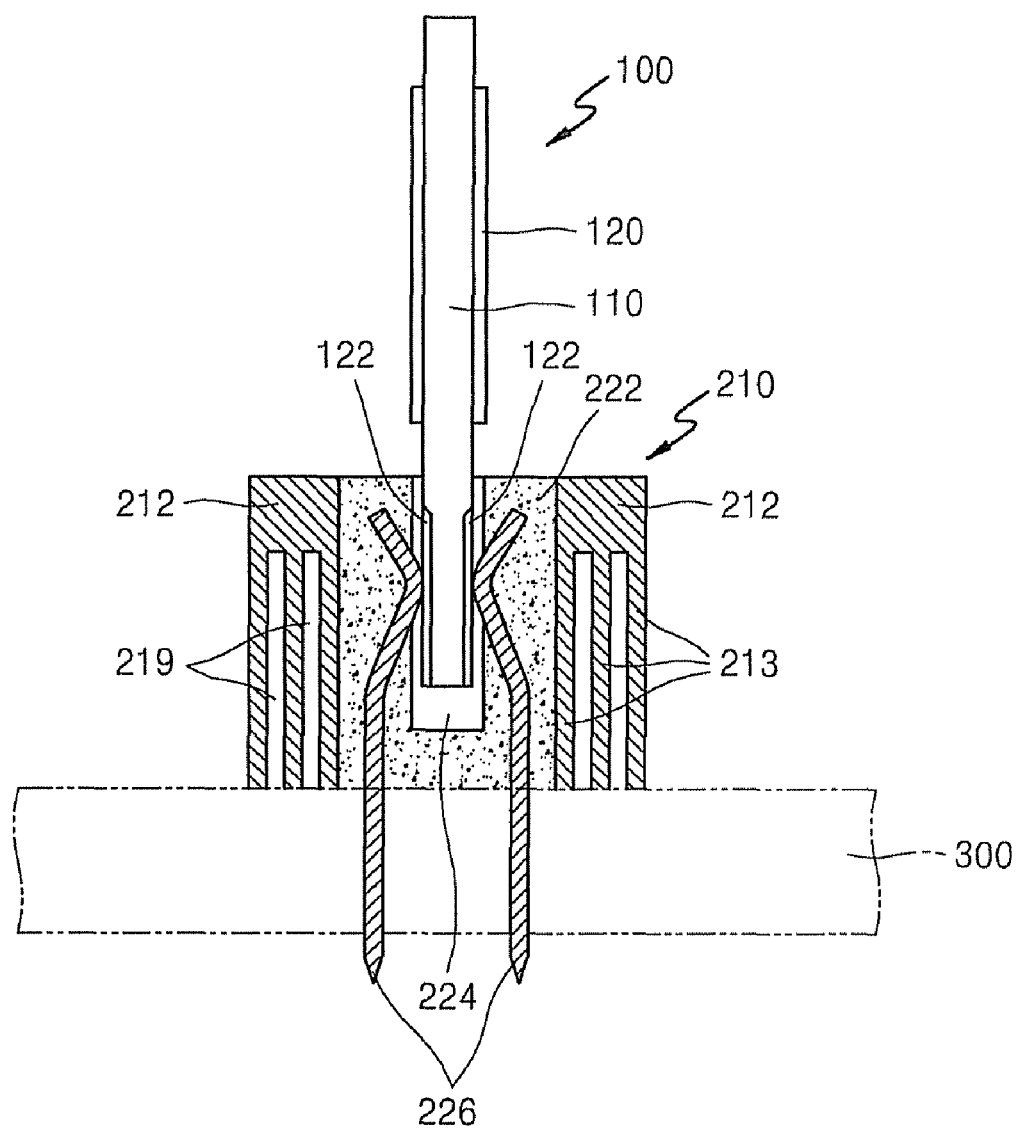
FIG. 6 is a cross-sectional view illustrating a state where the semiconductor module of FIG. 1 is inserted into the socket of FIG. 3.

FIG. 5 is an exploded perspective view for explaining a process of inserting or stabilizing the semiconductor module 100 of FIG. 1 in the socket 200 of FIG. 3. FIG. 6 is a cross-sectional view illustrating a state where the semiconductor module 100 of FIG. 1 is placed, fixed or inserted into the socket 200 of FIG. 3.

Referring to FIGS. 5 and 6, the semiconductor module 100 is placed, fixed or inserted into and supported or stabilized by the socket 200. In detail, the lower end of the PCB 110 of the semiconductor module 100 is placed, fixed or inserted into the slot 224 formed in the base member 210 of the socket 200, and the lower portions of both longitudinal and side ends of the PCB 110 are placed, fixed or inserted into the lower grooves 216 formed in the coupling portions 214. Accordingly, the circuit connecting tabs 122 arranged at the lower end portions of the PCB 110 electrically contact the socket pins 226 arranged at both sides of the slot 224 The exposed portions 114a of the ground metal layers 114 of the PCB 110 thermally contact the coupling portions 214 of the outer body 212. In order to more easily place, fix or insert the PCB 110 into the slot 224, the latch members 230 may be pivoted away from the center of the base member 210.

Figure 7:
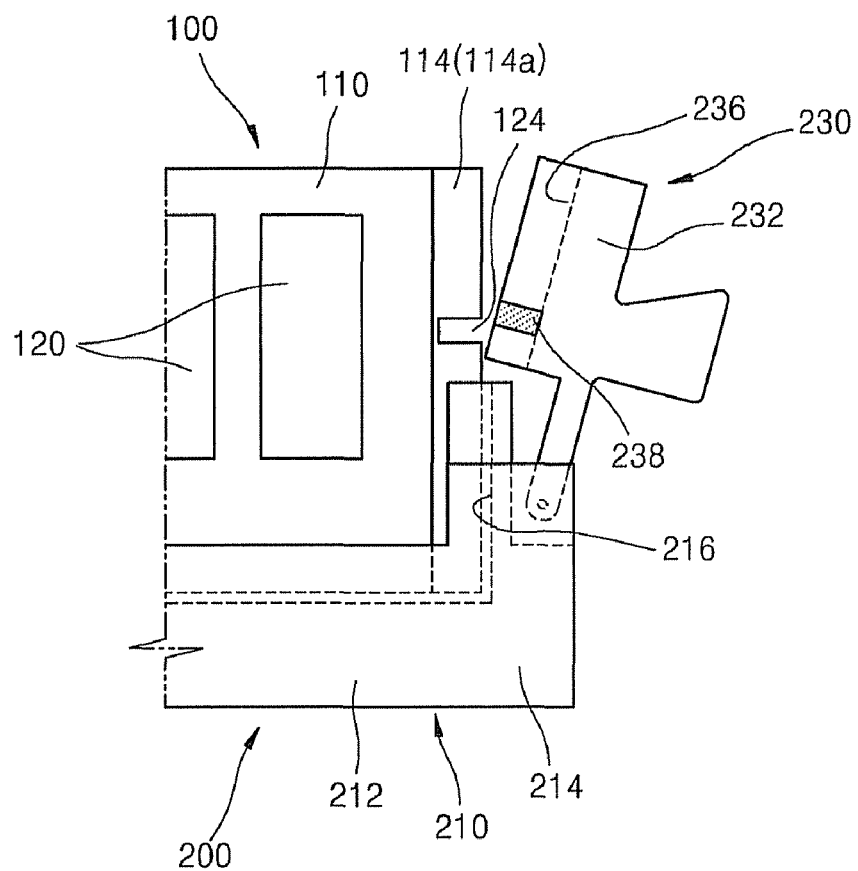
FIG. 7 is a partial front view for explaining a process of coupling latch members illustrated in FIG. 5 to the semiconductor module of FIG. 1.
Figure 8:
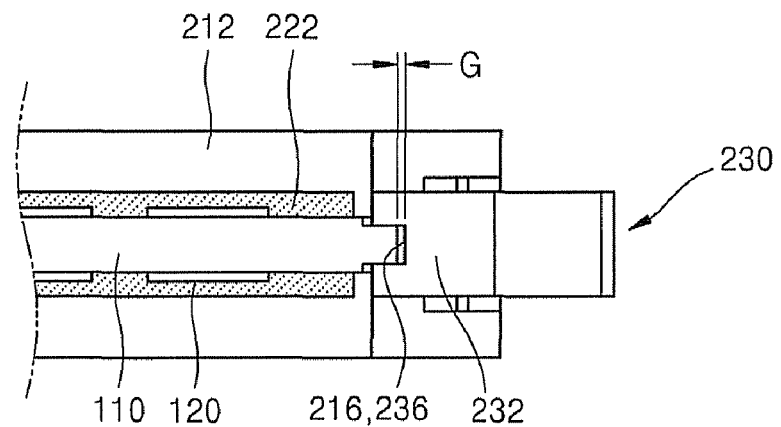
FIG. 8 is a partial plan view illustrating a state where the latch members illustrated in FIG. 5 are coupled to the semiconductor module of FIG. 1.

FIG. 7 is a partial front view for explaining a process of coupling the latch members 230 illustrated in FIG. 5 to the semiconductor module 100 of FIG. 1. FIG. 8 is a partial plan view illustrating a state where the latch members 230 illustrated in FIG. 5 are coupled to the semiconductor module 100 of FIG. 1.

Referring to FIGS. 7 and 8, when the lower end of the PCB 110 is placed, fixed or inserted into the slot 224 of the socket 200, the latch members 230 are pivoted and erected. At this time, the hooks 238 of the latch members 230 are placed, fixed or inserted into the hook insertion grooves 124 of the PCB 110, and the upper portions of both longitudinal and side ends of the PCB 110 are placed, fixed or inserted into the upper grooves 236 of the latch bodies 232. Accordingly, the semiconductor module 100 is fixed to the socket 200, and the exposed portions 114a of the ground metal layers 114 of the PCB 110 thermally contact the latch bodies 232.

If the metal layers 116 for signal lines of the PCB 110 are exposed at side surfaces of both longitudinal and side ends of the PCB 110, the metal layers 116 for signal lines do not need to contact the outer body 212 and the latch bodies 232 each formed of a metal. To this end, required, desired or predetermined gaps G may be formed between inner surfaces of the upper grooves 236 and the lower grooves 216 and the side surfaces of both longitudinal ends of the PCB 110.

As described above, according to the inventive concepts, the exposed portions 114a of the ground metal layers 114 are exposed at both longitudinal and side ends of the PCB 110 of the semiconductor module 100, and contact the latch bodies 232 and the outer body 212, of the socket 200. Wherein the latch bodies 232 and the outer body 212 are each formed of a metal. Accordingly, heat generated in the memory semiconductor devices 120 may be transferred to the socket 200 through the PCB 110, and may be efficiently dissipated by convection, radiation, and/or conduction to the main board 300. Once the cooling performance of the memory semiconductor devices 120 is improved in this way, the performance of the memory semiconductor devices 120 may be improved and the lifetime of the memory semiconductor devices 120 may be extended. Furthermore, an improved, enhanced or sufficient cooling performance is achieved without using a heat sink that is commonly used in the related art, and thus, heat sink manufacturing and assembly costs may be saved. Moreover, if necessary, a heat sink may be used in the semiconductor module 110 even further improving heat-dissipation efficiency within the system While the inventive concepts have been particularly shown and described with reference to exemplary embodiments thereof, it will be understood that various changes in form and details may be made therein without departing from the spirit and scope of the following claims. Accordingly, the scope of the inventive concepts is defined by the appended claims.

What is claimed is:

1. A socket into which a semiconductor module having a printed circuit board and a plurality of semiconductor devices mounted on the printed circuit board is inserted, the socket comprising:
a base member configured to couple to the printed circuit board of the semiconductor module; and
a plurality of latch members configured to secure the printed circuit board to the base member, the base member including,
an inner body having a slot into which a first end of the printed circuit board is inserted;

an outer body coupled to the inner body, the outer body being formed of metal, and the outer body including,
a plurality coupling portions, a first coupling portion being formed at a first end of the outer body, and a second coupling portion being formed at a second end of the outer body; and
a plurality of lower grooves formed in the plurality coupling portions and configured to allow lower portions of the printed circuit board to be inserted thereinto; and
the plurality of latch members including,
a first latch body and a second latch body including metal, the first latch body pivotably coupled to the first coupling portion and the second latch body pivotably coupled to the second coupling portion; and
a first upper groove formed in the first latch body and a second upper groove formed in the second latch body configured to allow each of upper portions of the printed circuit board to be inserted thereinto.

2. The socket of claim 1, wherein the outer body, the first latch body and the second latch body include copper (Cu) or aluminum (Al).

3. The socket of claim 1, wherein the outer body includes one or more air guide grooves.

4. The socket of claim 3, wherein the one or more air guide grooves are formed in a first surface of the outer body and extend in a first direction of the outer body.

5. The socket of claim 1, wherein, if the semiconductor module is inserted into the socket, the lower grooves and the first and the second upper grooves are aligned with each other.

6. The socket of claim 1, wherein the inner body includes an insulating material, and a plurality of socket pins arranged at both sides of the slot are coupled to the inner body.

7. The socket of claim 1, wherein each of the first latch body and the second latch body further comprise:
a hook inserted into each of hook insertion grooves of the printed circuit board.

8. The socket of claim 7, wherein the hooks include an insulating material, and are coupled as a separate member to a respective one of the first latch body and the second latch body.

9. A semiconductor module/socket assembly comprising:
a semiconductor module including;
a printed circuit board including a plurality of insulating layers and a plurality of metal layers that are alternately stacked; and
a plurality of semiconductor devices mounted on the printed circuit board; and
a socket for the semiconductor module including,
a base member including an inner body having a slot into which a lower end of the printed circuit board is inserted, an outer body formed of metal coupled to the inner body, and the outer body including,
a first coupling portion formed at a first end of the outer body and a second coupling portion formed at a second end of the outer body, and lower grooves formed in the first and the second coupling portions, and the lower groves configured to allow lower portions of a first and a second ends of the printed circuit board to be inserted thereinto, and the first end and the second end are at opposite ends of the printed circuit board, and a first latch member formed of metal and including a first latch body, the first latch body being pivotably coupled to the first coupling portion, and a second latch member formed of metal and including a second latch body, the second latch body being pivotably coupled to the second coupling portion, and the first and the second latch members configured to allow upper portions of the first and the second ends of the printed circuit board to be inserted thereinto,
wherein exposed portions of the plurality of metal layers are exposed to the outside of the semiconductor module at the first and the second ends of the printed circuit board, and the exposed portions of the plurality of metal layers contact the outer body, the first latch body and the second latch body the upper grooves, and the first coupling portion and the second coupling portion in the lower grooves.

10. The semiconductor module/socket assembly of claim 9, wherein
the plurality of insulating layers include outer insulating layers disposed on a first and a second surfaces of the printed circuit board and inner insulating layers;
the plurality of metal layers include ground metal layers disposed on inner surfaces of the outer insulating layers and signal lines, the signal lines and the inner insulating layers being alternately disposed between the ground metal layers; and
wherein portions of the outer insulating layers are removed from both ends of the printed circuit board so that the ground metal layers are exposed to the outside of the semiconductor module.

11. The semiconductor module/socket assembly of claim 9, wherein each of the plurality of metal layers, the outer body of the base member, the first latch body and the second latch bodies include copper (Cu) or aluminum (Al).

12. The semiconductor module/socket assembly of claim 9, wherein a plurality of circuit connecting tabs are arranged at lower portions of the printed circuit board, the inner body includes an insulating material, and a plurality of socket pins coupled to the inner body and the plurality of the socket pins arranged at both sides of the slot and electrically contact the plurality of circuit connecting tabs.

13. The semiconductor module/socket assembly of claim 9, wherein hook insertion grooves are formed in the first and the second ends of the printed circuit board, and the first latch member and the second latch member include a first and a second hooks that are configured to be inserted into a respective one of the hook insertion grooves formed in the first and the second ends of the printed circuit board.

14. The semiconductor module/socket assembly of claim 13, wherein the first and the second hooks include an insulating material, and are coupled as a separate member to a respective one of the first latch body and the second latch bodies.

15. The semiconductor module/socket assembly of claim 9, wherein the bottom surface of the outer body includes one or more air guide grooves, and the one or more air grooves extend in a first direction of the outer body.

16. The semiconductor module/socket assembly of claim 9, wherein, if the semiconductor module is inserted into the socket, the lower grooves and the upper grooves are aligned.

* * * * *